United States Patent [19]

Stehlin, Jr.

[11] Patent Number: 4,482,026

[45] Date of Patent: Nov. 13, 1984

[54] LOUDSPEAKER ENCLOSURE

[76] Inventor: George D. Stehlin, Jr., c/o Alexander Weilgart, 2337 Harrison St., Oakland, Calif. 94612

[21] Appl. No.: 446,422

[22] Filed: Dec. 2, 1982

[51] Int. Cl.[3] ............................................ H05K 5/100

[52] U.S. Cl. .................................... 181/152; 181/156; 181/199

[58] Field of Search ................................ 181/148–156, 181/145, 199; 381/87–90

[56] References Cited

U.S. PATENT DOCUMENTS

| | | | |
|---|---|---|---|
| 1,685,050 | 9/1928 | Gerns . | |
| 2,816,619 | 12/1957 | Karlson . | |
| 2,822,883 | 2/1958 | Allison . | |
| 2,896,736 | 7/1959 | Karlson . | |
| 2,986,229 | 5/1961 | Perkins, Jr. . | |
| 3,506,087 | 4/1970 | Ishikawa | 181/199 |
| 3,540,544 | 2/1970 | Karlson . | |
| 3,712,411 | 1/1973 | Monroe | 181/56 |
| 3,980,154 | 9/1976 | Johnson . | |
| 4,054,748 | 10/1977 | Balogh | 181/199 X |
| 4,173,266 | 11/1979 | Pizer . | |
| 4,179,008 | 12/1979 | LeTourneau . | |
| 4,196,792 | 4/1980 | Grieves et al. . | |
| 4,421,200 | 12/1983 | Ferralli et al. | 181/199 X |

FOREIGN PATENT DOCUMENTS 890886 3/1962 United Kingdom ................ 181/199

OTHER PUBLICATIONS

Wireless World–The Transmission–Line Loudspeaker Enclosure by A. R. Bailey, 5/72, p. 215, FIG. 1.

Stereo–The Amazing, Amazing by David B. Weems, Winter/73, p. 57.

*Primary Examiner*—L. T. Hix

*Assistant Examiner*—Della J. Rutledge

*Attorney, Agent, or Firm*—Fliesler, Dubb, Meyer & Lovejoy

[57] ABSTRACT

A loudspeaker enclosure with precisely dimensioned chambers to control and develop loudspeaker back wave energies almost exclusively as acoustical tensions. Focusing of these acoustical tensions is accomplished within each chamber so as to localize the several points of acoustical energy concentration optimally at the aperture positions between chambers. The second and also a third chamber operate to maintain proper load levels throughout the complex acoustical air column until eventual release into the listening space, the third, as well, creating essential reverberation and depth.

16 Claims, 5 Drawing Figures

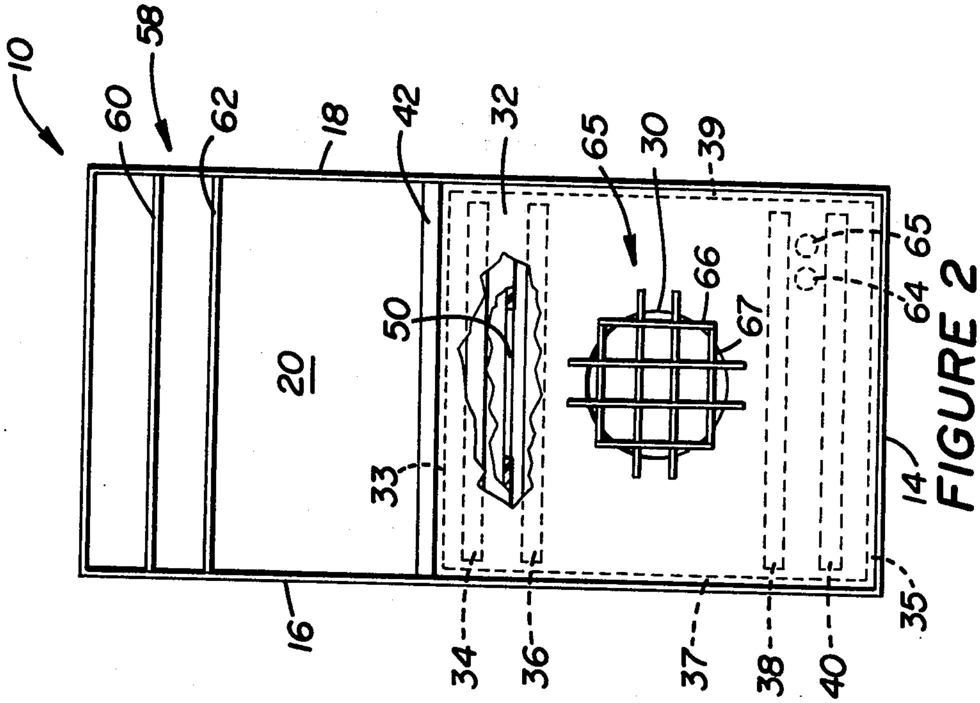
FIGURE 2
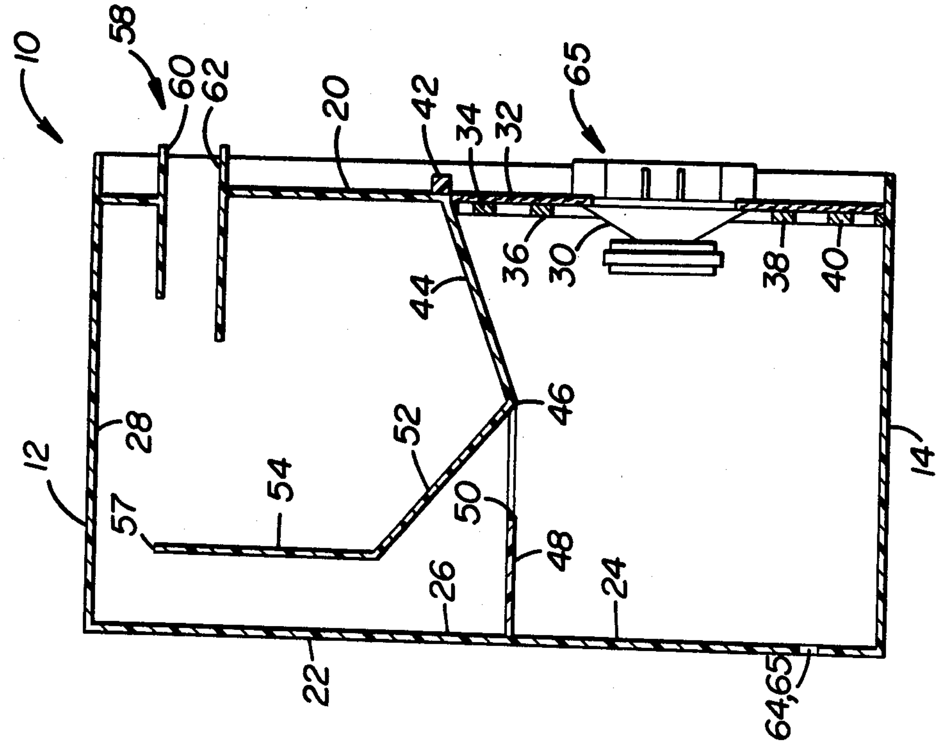
FIGURE I

LOUDSPEAKER ENCLOSURE

DESCRIPTION

TECHNICAL FIELD

The present invention relates to a loudspeaker enclosure and in particular to a loudspeaker enclosure for focusing acoustical tensions.

BACKGROUND ART

Prior art enclosures do not effectively control the back-wave acoustical tensions or provide for truly accurate load levels necessary to full exploitation of the highly perfected paper diaphragm type driver's total potential.

In the currently most general case of the "acoustical suspension" type of design, for instance, it is only the gross atmospheric, not acoustical, pressure generating behavior of the driver cone working against a very confined air space behind the driver which is considered in the designs of this type.

In other types of prior art, the back wave tensions appear in the space behind the speaker and are either irregularly dissipated to some significant extent or subjected to various types of relatively ineffective treatment when compared to that of the present design.

It is necessary, by means of a multi-stage loading and back-wave recovery and phase-inversion system, to create a carefully adjusted elastic air column for proper development of the back wave acoustical pressures (or tensions) so as to provide for several specific load levels necessary to proper direct radiator (front wave) performance and to fullest exploitation of the back wave's contribution to the final acoustic output of the system.

The present invention is directed to providing for appropriate load levels at the several required points of focus in the multi-stage system where transitions occur between chambers primarily and of the greatest possible secondary importance, for the final refinement of reverberation enhancement for the developed back wave which is an additional capability of this design.

DISCLOSURE OF THE INVENTION

In one aspect of the invention, a loudspeaker enclosure comprises a first chamber which has a front wall adapted to mount the loudspeaker, a plurality of side walls and a back wall, a second chamber located adjacent one of the side walls of the first chamber, and aperture means for communicating the first chamber with the second chamber, which aperture means is provided through said one of the side walls, substantially in the middle of said sidewall.

In another aspect of the invention the second chamber has a diminishing cross-section extending from the aperture means away from the first chamber.

In still another aspect of the invention, the loudspeaker enclosure includes a third chamber which follows after the first and second chambers.

An object of the invention is to have aesthetically more adequate clean natural sound with a minimum of distortion.

Another object of the invention is to have a highly efficient transfer of back-wave energies substantially and adequately in-phase with the directly radiated sound, creating accurate, natural low frequency registration especially at very low listening levels.

Another object of the invention is to require less electrical energy input for the same created volume of sound and so be more energy efficient.

Another object of the invention is to secure an adequate reverberation effect with the back wave to create spaciousness and depth as in a concert hall, which effect is elsewhere accomplished by the addition of expansive electronic units.

Another object is to have an enclosure that is much less expensive to manufacture than the cabinetry of most wood enclosures.

BRIEF DESCRIPTION OF THE DRAWINGS

FIG. 1 is a cross-sectional side view of an embodiment of the loudspeaker enclosure of the invention.

FIG. 2 is a front elevational view of the embodiment of FIG. 1.

DETAILED DESCRIPTION OF THE PREFERRED EMBODIMENT

Figure 4:
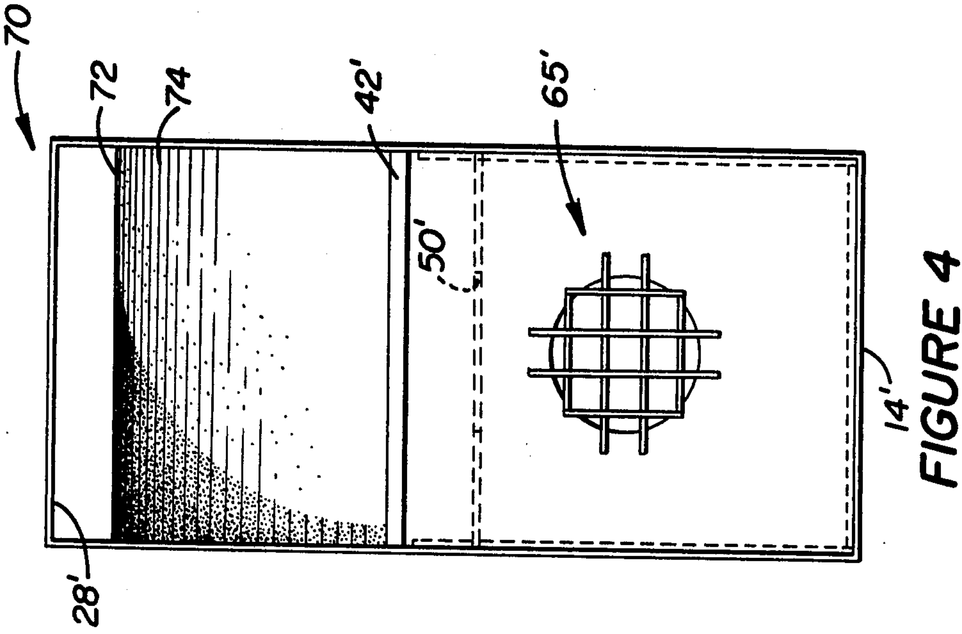
FIG. 4 is a front view of the embodiment of FIG. 3.

With reference to the Figures, and in particular to FIGS. 1 and 2, an embodiment of the loudspeaker enclosure or acoustical capacitor is depicted and denoted by the numeral 10. Enclosure 10 is substantially a rectangular box with top, bottom, first side, second side, front and back walls 12, 14, 16, 18, 20, 22 respectively. In a preferred embodiment, top and bottom walls 12, 14 measure about 11 inches×11 inches, first and second side walls 16, 18 measure about 21½ inches high×11 inches deep and front and back walls 20, 22 measure about 21½ inches high and 11 inches deep.

Enclosure 10 defines first, second and third chambers 24, 26, 28 respectively. In a preferred embodiment a full-range high quality, long throw piston speaker 30 of approximately six square inches surface area, is attached to a front panel 32 which is preferably comprised of spruce or cedar, which panel 32 fronts only the first chamber 24 and thus comprises the lower portion of front wall 20. Panel 32 is approximately 10 inches high. The remainder of the above walls and the to be described walls and partitions are comprised preferably of a polished acrylic or other material which does not absorb sound as wood does. It is to be understood that other materials and speaker arrangements can be substituted for the above mentioned materials and speaker and still remain within the scope of this invention.

The front panel 32 is secured in place all along its top, bottom and sides by attachment to approximately ¼ inch strips such as strip 33, 35, 37, 39 attached to cross bar 42, bottom 14, and side walls 16 and 18. Contributing support to front panel 32 are four horizontal wood braces or ribs 34, 36, 38, and 40 which do not connect to the side walls 16, 18 or strips 33, 35, 37, and 39.

Partially defining the first chamber 24 and secured to front wall 20 is a plate 44 which slopes downwardly from front wall 20 at a twenty degree angle from the horizontal in a preferred embodiment (a seventy degree acute angle is defined between plate 44 and wall 20). Plate 44 projects approximately 5 inches horizontally rearwardly to about midpoint between front and back walls 20, 22. Connected at the lowest horizontal line 46 of plate 44 is another plate 48, which plate 48 is horizontal and about 6 inches deep. Plate 48 is secured to back wall 22 and first and second side walls 16, 18. Within horizontal plate 40 is a rectangular opening 50 which in a preferred embodiment has the dimension of about 3 inches deep×4 inches across. Opening 50 is defined along its front edge by line 46 and is midway between side walls 16, 18. Opening 50 extends from about the middle of chamber 24, rearwardly.

The rear wall 22 has two adjacent ports 64 and 65 adjacent bottom wall 14 for accepting fuse and speaker lead fixtures.

The second chamber 26 is bounded by plate 48, backwall 22 and side walls 16, 18. The front of second chamber 26 is bounded by plates 52, 54 which extend between side walls 16, 18. Lower plate 52 is disposed at an angle of 40° from the horizontal, is joined to plate 44 and is sloped upwardly and rearwardly from line 46. The upper plate 54 is substantially vertical. It is noted that plate 54 extends to within about 1⅝ inch of top wall 12. Above plate 54 the second chamber 26 opens into the third chamber 28 through opening 57. Opening 57 is larger than opening 50 in total area and extends fully from first side wall 16 to second side wall 18 and from the top of plate 54 to top wall 12.

Third chamber 28 is highly asymmetric, particularly because of plates 44, 52. Opening 58 communicates third chamber 28 with the outside of enclosure 10. At the top of opening 58 is a horizontal plate or lip 60 and at the bottom of opening 58 is a horizontal plate or lip 62. Lip 60 does not extend as far rearwardly as does lip 62. In fact, in a preferred embodiment, lip 62 extends about 4 inches into third chamber 28 from front wall 20 while lip 60 extends about 3 inches into third chamber 28 from the portion of the front wall 20 which extends below the opening 58. Lips 60, 62 extend outwardly from front wall 20 equal distances which are approximately 1¼ inches. It is to be understood that the portion of the front wall 20 above opening 58 is slightly set back from the portion of front wall 20 below opening 58 and that the portion of front wall 20 below opening 58 is set back relative to the leading edge of side walls 16, 18 approximately 1 inch.

In this enclosure the first chamber 24 has approximately half the overall volume, the second chamber 26 has approximately one-sixth, and the third chamber 28 has approximately one third the overall volume.

A debeaming grill 65 is located in front of loudspeaker 30. Grill 65 is substantially diamond shaped and includes vertical and horizontal crossed strips 66, 67. Strips 67 are about ⅞ inch deep while strips 66 are about 1 inch deep.

Figure 5:
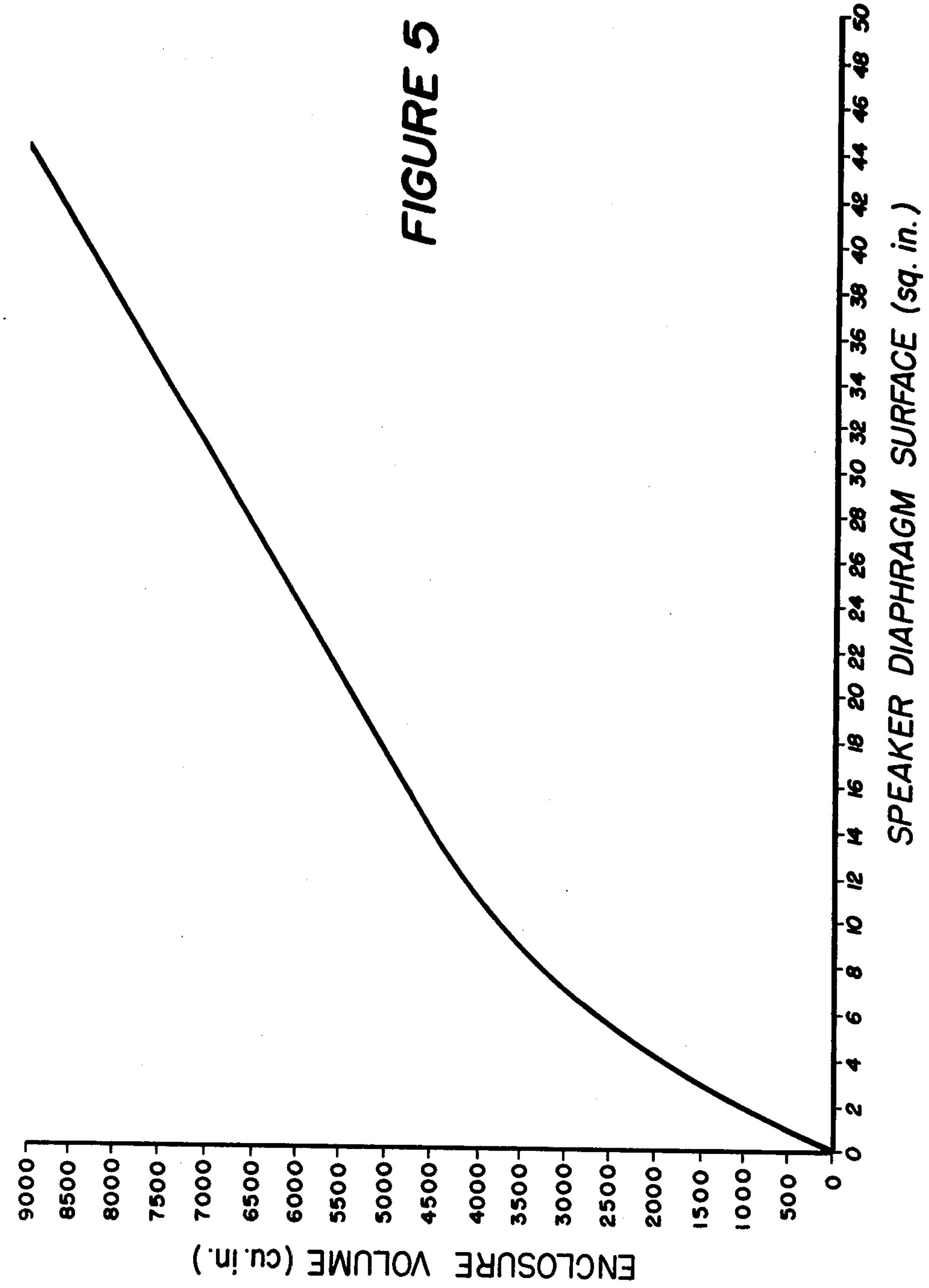
FIG. 5 is a graph of the preferred loudspeaker enclosure volume to loudspeaker size.

The relationship of the overall loudspeaker enclosure volume to the net effective radiating surface area of the loudspeaker diaphragm(s) is shown in FIG. 5. For example, for a loudspeaker with a diaphragm that has six square inches the volume is 2614 cubic inches, for twelve square inches the volume is 4320 cubic inches, and for twenty-four square inches the volume is 6048 cubic inches.

Also, it is to be understood that the size of opening 50 is about equal to the diaphragm size when the diaphragm is about forty-seven square inches and is about double when the diaphragm is about six square inches.

Figure 3:
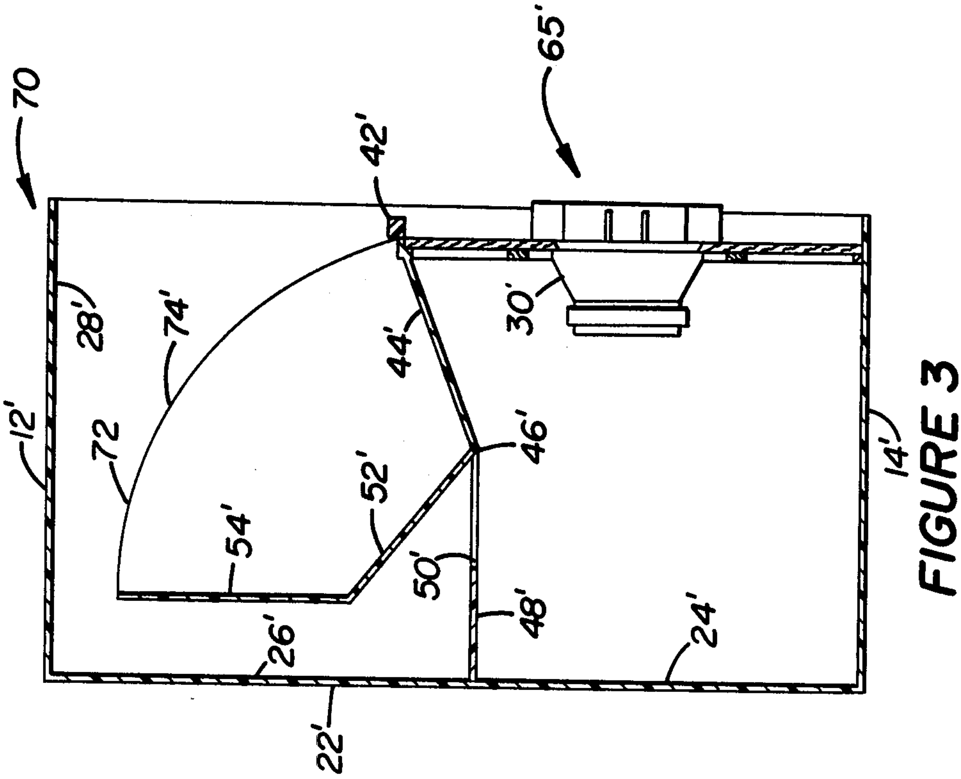
FIG. 3 is a cross-sectional side view of another embodiment of the loudspeaker enclosure of the invention.

Another embodiment of the loudspeaker enclosure of the invention is depicted in FIGS. 3, 4 and denoted 70. Loudspeaker enclosure 70 is substantially identical to enclosure 10, with like elements having the same element number, which has been primed, except that enclosure 70 does not include a third chamber. Instead, enclosure 70 includes a second chamber 26' which has a hornlike extension 72. Hornlike extension 72 is defined by a curved partition 74 which extends from the top of plate 54' to crossbar 42'.

Another embodiment of this invention (not shown) includes four loudspeakers, each of a size similar to loudspeaker 30 and arranged in a diamond pattern. The enclosure is proportionally the same as enclosure 10. However, it has been scaled up to accomodate the four speakers according to the graph of FIG. 5.

INDUSTRIAL APPLICABILITY

The operation of this invention is as follows.

The main accomplishment of this loudspeaker enclosure is the creation of a specific type of loading. This loading is such that with an impulse from the loudspeaker, front waves and back waves are generated with the back wave being directly proportional to that impulse. The back wave does not operate to make pressures as in acoustical suspension devices where the back wave sets up a basically unvarying constant air cushion. In the loudspeaker enclosure or acoustical capacitor the loading is flexible, elastic, and varies with the loudspeaker or driver impulse creating acoustical tensions. Such an arrangement sets up maximum coupling between the enclosed air space and the diaphragm of the loudspeaker and the listening space external to the enclosure and creates the most efficient and the most distortion-free sound.

The sound waves in the first chamber 24 proceed from the diaphragm of loudspeaker 30 in the form of a hemisphere or bell, radiating out from the diaphragm. The reasons for the twenty degree angle of the plate 44 at the front and top of the first chamber 24 is that if the speaker 30 were placed in a same volumetric sized strictly rectangular chamber, the sound waves from the speaker would be significantly crowded, whereas to raise the height of the first chamber 24 with this twenty degrees plate 44 allows more area in which to center the speaker 30 so that the sound waves are not crowded. Also, this twenty degree angle gives the first chamber 24 something of the effect of an inverted horn whose cross-section is, as closely as possible proportional to the volume of sound at any given point in its development.

The shape of the rest of the first chamber 24, is so as to achieve symmetry so that the acoustical tensions are not deflected and dissipated throughout the chamber but flow from the diaphragm to rebound from rear, top, bottom and sides of the chamber, and partially rebounding to the diaphragm for loading. The concern in the first chamber 24 is to set up only acoustical pressures (or tensions) and to cause these to focus at the point where this chamber opens, through a relief port into chamber number two. The dimensions of the first chamber 24, empirically determined, are set as far as possible from positions producing obvious flatness due to excessive dissipation or energy waste and on the other hand as far as possible from positions which produce peaking due to standing waves. With the finally correct tuning, both flatness and peaking not only disappear, but there also occurs a sudden and sharp rise in overall efficiency especially throughout the bass end of the spectrum as well as a vanishing of coloration.

Acoustical tensions being maintained means that individual molecules of air oscillate about fixed positions and the center of gravity of the individual chambers' enclosed air volume is not appreciably displaced by the speaker cone action. With the flow control maintenance of acoustical tensions in first chamber 24 is created initially, a "bubble" of vibrational oscillations (acoustical tensions) which after first forming, is eventually symmetrically reflected so as to focus ultimately, by reason of the proportioning of chamber 24, immediately beneath the center of opening 50 of first chamber 24. The focal point within this "bubble" collects as a shimmering curtain in the center back of the first chamber, this curtain being positioned flatwise to the radiations of the speaker and the focal point being particularly intense just below the point of the center of the curtain due to the horn nature of the first chamber 24.

This first chamber 24 has half the volume expected in an infinite baffle enclosure which infinite baffle enclosure is defined as an enclosure that is just large enough to completely absorb or dissipate the back wave. Thus large overloading on the diaphragm of speaker 30 and a large creation of pressures could be expected. However, this is not the case due to the excess acoustical tensions being bled out of first chamber 26 through opening 50. This is a very efficient and controlled transfer of energies from the first chamber 24 to the second chamber 26.

The opening 50 into the second chamber 26 is directly above the focal point for optimum relief from the first chamber 24. The dimensioning of this opening acts as in any capacitor to determine and regulate the energies it allows to be transmitted, being in one respect neither too large so as to excessively dissipate tensions within the first chamber nor too small so as to create pressure overloading.

Not only is a correctly shaped and dimensioned first chamber 24 required, but an opening 50 in the right place and of the right dimensions is also required for correct loading of the first and second stages and overflow control for chamber number two 26.

The above accomplishes part of the ideal type of loading on the diaphragm of the speaker and also a very complete transfer of acoustical tensions from the first chamber 24 to the second chamber 26.

With respect to the second chamber 26, once relief is effected by acoustical tensions escaping through the opening 50, these acoustical tensions are maintained in the second chamber 26 and propelled forward by a sharp narrowing of the acoustical column. This narrowing maintains the pressure which would otherwise drop at a rate of the square of the distance from the source. Since curved surfaces tend to color sound, the equivalent curve is approximated with plane surfaces. It is necessary for the acoustical tensions to be propelled forward in the second chamber 26 otherwise the capacitance behavior in the first chamber 24 would be thrown out of alignment, and reduced. Without the narrowing of the acoustical column in the second chamber 26, proper increased loading for the overflow from the first chamber 24 would not be maintained. Again, failure to maintain the given proportions from the first chamber 24 into the second and third chambers 26, 28 would result in imperfect loading and chamber capacitance.

The location of the focal point in the third chamber, the point of collection of the reflected acoustical tensions, is first at the center of that chamber and finally, directly behind opening 58, at its center. It is for this reason that opening 58 is positioned where it is, directly in front of the final position of the final focal point, (for that portion of the acoustical tensions not immediately escaping forwardwise from opening 57 through opening 58) as placement of the opening 58 above or below this position causes a nasal quality to the finally released sound. The purpose for the lips 60, 62 of opening 58 extending into the third chamber 28 is for narrowing the acoustical column again before exit into the listening space, thereby maintaining proper loading for the third chamber 28 as well as for the system as a whole. The outermost extension of these lips 60, 62 beyond the front wall 20 and beyond the most forward extension of the side walls 16, 18, aids the sound in its lateral dispersion into the listening space. The third chamber releases largely bass and lower middle range frequencies.

The third chamber accomplishes another significant value other than residual loading. It adds reverberation effects and depth to the sound. Reverberation effects are developed in the third chamber, plates 44, 52 operating as something of a sound trap and echo chamber.

With respect to the embodiment in FIGS. 3 and 4, approximately the same loading can be accomplished with enclosure 70, though without the reverberation effects. In this embodiment the residual loading is accomplished by a horn extending from the opening 57' from the second chamber 26'. This horn is merely an extension of the second chamber 26' and does not operate as a separate chamber. While a two-chamber acoustical capacitor 70' is therefore mechanically possible, a three-chamber acoustical capacitor 10 with reverberation effects is preferred.

Apart from the preferably wood paneling at the front of the first chamber (acrylic can also there be used but not as effectively), the rest of the enclosure is preferably made of polished acrylic. Acrylic has a homogeneity and calculated elasticity that gives a significantly greater efficiency especially in the bass region than the most carefully selected thicknesses and types of woods. There is not the absorption of sound associated with wood; nor the transmission characteristics of wood because of its greater porosity and inhomogeneity.

The debeaming device at the front of the larger four driver embodiment is designed so that the air space between vertical and horizontal plates is about $\frac{5}{8}$ inch $\times$ $\frac{5}{8}$ inch. This $\frac{5}{8}$ inch distance is geared to the upper practical audible frequency limit of 17,000 Hz.

The single driver embodiment has an approximately $\frac{7}{8}$ inch $\times$ $\frac{7}{8}$ inch spacing as the single driver is close to floor level so that less debeaming is called for in the extreme upper frequency range. The larger embodiment uses vertical plates approximately $\frac{1}{8}$ inch deeper than the horizontal plates, which favors greater dispersion in the vertical plane for larger listening areas, the depth of plates being approximately one inch and $\frac{7}{8}$ inch respectively.

Other aspects, objects and advantages of this invention can be obtained from a study of the drawings, the disclosure and the appended claims.

I claim:

1. A loudspeaker enclosure comprising:

a first chamber adapted to mount a loudspeaker which first chamger has a front wall adapted to mount the loudspeaker, a plurality of side walls including first, second, third and fourth side walls and a back wall, each of said first, second, third and fourth side walls connected to said front wall and to said back wall to form said first chamber;

a second chamber located adjacent said first side wall of the first chamber;

aperture means for communicating the first chamber with the second chamber, which aperture means is provided through said first side wall, substantially extending toward the back wall from a point substantially midway between the front and back walls, and not contacting the back wall or either of the second or fourth side walls.

2. The loudspeaker enclosure of claim 1 wherein the first chamber is horn shaped such that a portion of the first side wall extends rearwardly and inwardly from the front wall at approximately a seventy degree angle, to a point approximately one half the distance between the front and back walls.

3. The loudspeaker enclosure of claim 1 wherein the aperture means is substantially rectangular and has a first dimension which extends between the front and back wall which is approximately three-fourths of a second dimension which extends substantially perpendicular to the first dimension.

4. The loudspeaker enclosure of claim 1 wherein the second chamber has a first portion with a diminishing cross-section located adjacent the first chamber and a second portion with a constant cross-section located adjacent the first portion;

wherein the first portion is partially defined by a sloping wall which is disposed approximately adjacent to the portion of the aperture means located closest to said front wall.

5. The loudspeaker enclosure of claim 4 wherein said sloping wall of the said diminishing portion slopes toward said back wall.

6. The loudspeaker enclosure of claim 4:

wherein the second portion is substantially elongate and substantially parallel to the back wall;

wherein said second portion of said second chamber includes another aperture which is disposed substantially parallel to the back wall and opens in the direction of the loudspeaker; and includes a third chamber which is located following the first and second chamber and which communicates with said another aperture, said third chamber including a third aperture means which opens the third chamber to the external environment, which third aperture means includes substantially parallel and spaced apart planar members which extend into both the third chamber and the external environment.

7. The loudspeaker enclosure of claim 6 wherein the size of the aperture means and the third aperture are approximately equal and smaller than the size or another aperture.

8. The loudspeaker enclosure of claim 6 wherein the first, second and third chambers define a total volume which is divided among the chambers one half to the first chamber, one sixth to the second chamber and one third to the third chamber.

9. The loudspeaker enclosure of claim 6 wherein first, second and third chambers together define a total volume which has overall dimensions of height being approximately twice the width and approximately one and three-fourths the depth.

10. The loudspeaker enclosure of claim 1 including a debeaming grill located in front of the loudspeaker and including a first set of horizontal parallel plates disposed substantially perpendicular to the plane of the front of the speaker and a second set of vertical parallel plates which intersect the first set, the distance between parallel horizontal and vertical plates being approximately $\frac{5}{8}$ to $\frac{7}{8}$ inches, with a depth of approximately $\frac{7}{8}$ inches.

11. The enclosure of claim 10 wherein the horizontal plates have a depth somewhat less than the vertical plates.

12. The loudspeaker enclosure of claim 1 wherein said first and second chambers are composed of plastic.

13. The loudspeaker enclosure of claim 1 wherein the front wall is comprised of wood and the rest of the first chamber and the second chamber is comprised of plastic.

14. The loudspeaker enclosure of claim 1 wherein:

said second chamber has a first portion with a diminishing cross-section located adjacent the first chamber;

said first portion including a sloping wall disposed approximately adjacent to the portion of the aperture means located closest to said front wall, said sloping wall disposed in an outwardly sloping manner from the front wall to the back wall; and said second chamber having a second portion with a constant cross-section located adjacent the first portion and disposed substantially perpendicular to the first side wall.

15. The loudspeaker enclosure of claim 1 wherein the loudspeaker includes a diaphragm and wherein the size of the aperture means is approximately twice the size of the diaphragm.

16. The loudspeaker enclosure of claim 1 wherein said second chamber has another aperture and wherein said enclosure includes a horn which communicates with said another aperture.

* * * * *

UNITED STATES PATENT AND TRADEMARK OFFICE

CERTIFICATE OF CORRECTION

PATENT NO. : 4,482,026

DATED : November 13, 1984

INVENTOR(S) : George D. Stehlin, Jr.

It is certified that error appears in the above-identified patent and that said Letters Patent is hereby corrected as shown below:

Column 2, line 7, "expansive" should be --expensive--.

Column 7, line 48, "or" should be --of--.

Signed and Sealed this

*Sixteenth* Day of *April 1985*

[SEAL]

*Attest:*

DONALD J. QUIGG

*Attesting Officer* *Acting Commissioner of Patents and Trademarks*